US012681067B2

(12) United States Patent
Lee

(10) Patent No.: US 12,681,067 B2
(45) Date of Patent: Jul. 14, 2026

(54) APPARATUS FOR DIAGNOSING BATTERY OF VEHICLE, BATTERY DIAGNOSTIC METHOD THEREOF, AND VEHICLE SYSTEM COMPRISING SAME

(71) Applicants: Hyundai Motor Company, Seoul (KR); Kia Corporation, Seoul (KR)

(72) Inventor: Jung Hyun Lee, Yongin-si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 165 days.

(21) Appl. No.: 18/610,094

(22) Filed: Mar. 19, 2024

(65) Prior Publication Data

US 2025/0076361 A1      Mar. 6, 2025

(30) Foreign Application Priority Data

Sep. 4, 2023     (KR) ........................ 10-2023-0117151

(51) Int. Cl.
*G01R 31/00* (2006.01)
*G01R 19/165* (2006.01)
*G01R 19/25* (2006.01)

(52) U.S. Cl.
CPC ..... *G01R 31/007* (2013.01); *G01R 19/16542* (2013.01); *G01R 19/2506* (2013.01)

(58) Field of Classification Search
CPC ... B60L 58/18; B60L 2240/547; G01R 31/52; G01R 1/206; G01R 19/16542; G01R 19/16576; G01R 19/16504; G01R 19/16528; G01R 19/16533; B60Y 2200/91; B60Y 2306/15; B60Y 2400/112; Y02E 60/10; Y02T 10/70; Y02T 10/72
See application file for complete search history.

(56) References Cited

U.S. PATENT DOCUMENTS

| | | | | |
|---|---|---|---|---|
| 8,643,328 | B2 * | 2/2014 | Miyamoto ........ | H01M 10/4207 |
| | | | | 320/109 |
| 11,848,430 | B2 * | 12/2023 | Kain ................... | H01M 10/425 |
| 12,085,626 | B2 * | 9/2024 | Lee ....................... | G01R 31/396 |
| 12,422,497 | B2 * | 9/2025 | Sung ................. | G01R 31/3648 |
| 2016/0294019 | A1 * | 10/2016 | Yamauchi ............. | H01M 10/48 |
| 2022/0268853 | A1 * | 8/2022 | Lee ......................... | H02J 7/005 |
| 2025/0076393 | A1 * | 3/2025 | Lee ....................... | G01R 31/392 |

* cited by examiner

*Primary Examiner* — Vinh P Nguyen
(74) *Attorney, Agent, or Firm* — Fish & Richardson P.C.

(57) ABSTRACT

The disclosure relates to an apparatus for diagnosing a battery of a vehicle, the apparatus being capable of performing reliable diagnosis with respect to low voltage of a battery of a vehicle, a battery diagnostic method thereof, and a vehicle system including the same. The apparatus may include a voltage sensor measuring voltage of a plurality of battery cells in the battery, and a processor performing low voltage diagnosis with respect to the battery on the basis of the cell voltage measured by the voltage sensor. The processor may determine whether or not the cell voltage satisfies a preset diagnostic condition when the cell voltage satisfies a diagnosis start condition, and when the processor determines that the cell voltage satisfies the diagnostic condition, the processor may diagnose that the battery is at a low voltage state.

12 Claims, 3 Drawing Sheets

APPARATUS FOR DIAGNOSING BATTERY OF VEHICLE, BATTERY DIAGNOSTIC METHOD THEREOF, AND VEHICLE SYSTEM COMPRISING SAME

CROSS REFERENCE TO RELATED APPLICATIONS

The present application claims priority to Korean Patent Application No. 10-2023-0117151, filed Sep. 4, 2023, the entire contents of which is incorporated herein by reference.

TECHNICAL FIELD

The present disclosure relates to an apparatus for diagnosing a battery and, more particularly, to an apparatus for diagnosing a battery of a vehicle, the apparatus being capable of performing reliable diagnosis with respect to low voltage of a battery of a vehicle, a battery diagnostic method thereof, and a vehicle system including the same.

BACKGROUND

Since a plurality of battery cells, which are secondary batteries, make up one pack, and multiple packs make up one large capacity battery, it is more important to keep a battery for electric vehicles safer than for general portable electric products.

Moreover, abnormal deterioration of the battery that occurs during high-load driving causes low voltage due to a sharp drop in battery voltage. Continuous use of batteries in such a low voltage state causes over-discharge and intensified cell swelling, and is presumed to be one of the causes of fires in operating of electric vehicles.

The current low voltage diagnosis technology diagnoses that the battery is at a low voltage state when a situation where a battery cell voltage is less than 1.5V is maintained for 5 seconds. However, the rate of voltage drop that occurs when the battery cell is excessively deteriorated is fast, so the battery cell voltage enters the voltage sensing abnormality range (less than 0.5V) before 5 seconds. In vehicle driving evaluation, it was confirmed that the current low voltage diagnosis technology has limitations in diagnosing low voltage in a voltage drop situation that occurs when excessive cell deterioration occurs for the above reasons.

In addition, the sudden drop in voltage that occurs in a state of excessive degradation of battery cells does not meet a diagnostic condition of the logic that diagnoses voltage sensing abnormality (voltage sensing abnormality diagnosis logic) when the state of than 0.5V is maintained for 30 seconds.

Therefore, since the voltage drop that occurs when the battery cell is excessively deteriorated is not diagnosed by the low voltage diagnosis logic and voltage sensing abnormality diagnosis logic, and the vehicle continues to drive, which may cause a fire.

Likewise, in order to ensure the safety of electric vehicles, technology is required to effectively diagnose the low voltage even in situations where the battery's voltage suddenly drops.

Meanwhile, when the conventional voltage sensing abnormality diagnostic condition is changed, problems with misdiagnosis and over-diagnosis may occur due to the change, so a method that can improve the reliability of low voltage diagnosis while maintaining the conventional voltage sensing abnormality diagnostic condition is required.

The foregoing is technical information that the inventor possessed to derive the present disclosure or was acquired in the process of deriving the present disclosure, and is not necessarily the related art that was disclosed to the general public prior to the filing of the present disclosure.

SUMMARY

The implementations disclosed in the present disclosure were proposed in response to the above-mentioned request, and the present disclosure has a technical objective of provide an apparatus for diagnosing a battery of a vehicle, the apparatus being capable of performing reliable diagnosis with respect to a low voltage of a vehicle battery, a battery diagnostic method thereof, and a vehicle system including the same.

Another objective of the present disclosure is to provide an apparatus for diagnosing a battery of a vehicle, the apparatus being capable of performing both of low voltage diagnosis of a vehicle battery and a disconnection diagnosis (or voltage sensing abnormality diagnosis) of a power line of a battery cell, a battery diagnostic method thereof, and a vehicle system including the same.

Yet another objective of the present disclosure is to provide an apparatus for diagnosing a battery of a vehicle, the apparatus being implemented to diagnoses low voltage and disconnection on the basis of different_reference times considering that a voltage drop speed in occurrence of voltage sudden drop and a voltage drop speed in occurrence of disconnection (or voltage sensing abnormality) are different from each other, a battery diagnostic method thereof, and a vehicle system including the same.

Still another objective of the present disclosure is to provide an apparatus for diagnosing a battery of a vehicle, the apparatus being implemented to perform battery voltage diagnosis and disconnection diagnosis of a power line of a battery cell by determining diagnosis entry (or diagnosis start) on the basis of a disconnection diagnosis reference voltage (e.g., 0.5V) and a low voltage diagnosis reference voltage (e.g., 1.5V), a battery diagnostic method thereof, and a vehicle system including the same.

Still another objective of the present disclosure is to provide an apparatus for diagnosing a battery of a vehicle, the apparatus being implemented to perform low voltage diagnosis regardless of a disconnection diagnosis result when a battery cell voltage satisfies an entry condition, a battery diagnostic method thereof, and a vehicle system including the same.

The technical problem to be achieved in the present disclosure is not limited to the abovementioned, and other problem intended by the present disclosure will be clearly understood by those skilled in the art from the description below.

As a technical means for achieving the above-described technical objectives, there may be provided an apparatus for diagnosing a battery of a vehicle, the apparatus being capable of performing reliable diagnosis with respect to low voltage of the vehicle battery, a battery diagnostic method thereof, and a vehicle system including the same.

In some implementations, there may be provided the apparatus for diagnosing a battery of a vehicle, the apparatus being capable of performing both of low voltage diagnosis of a vehicle battery and a disconnection diagnosis (or voltage sensing abnormality diagnosis) of a power line of a battery cell, the battery diagnostic method thereof, and the vehicle system including the same.

In some implementations, there may be provided the apparatus for diagnosing a battery of a vehicle, the apparatus being implemented to perform diagnosis by applying different time references to each of low voltage diagnosis and disconnection diagnosis, the battery diagnostic method thereof, and the vehicle system including the same.

In some implementations, there may be provided the apparatus for diagnosing a battery of a vehicle, the apparatus being implemented to perform low voltage diagnosis regardless of a disconnection diagnosis result when a battery cell voltage satisfies an entry condition, the battery diagnostic method thereof, and the vehicle system including the same.

According to another aspect of the present disclosure, the apparatus for diagnosing a battery of a vehicle may include a voltage sensor measuring voltage with respect to a plurality of battery cells in the battery, and a processor performing low voltage diagnosis of the battery on the basis of the cell voltage measured by the voltage sensor.

In some implementations, when cell voltage satisfies a diagnosis start condition the processor may determine whether or not the cell voltage satisfies a preset diagnostic condition, and when the processor determines that the cell voltage satisfies the diagnostic condition, the processor may diagnose that the battery is at a low voltage state.

In some implementations, the processor may determine that the cell voltage satisfies the diagnosis start condition when the cell voltage is maintained for a preset first reference time or more while satisfying a diagnosis start voltage condition.

In some implementations, the process may determine that the cell voltage satisfies the diagnosis start voltage condition when the cell voltage is equal to or greater than a first reference voltage and less than or equal to a second reference voltage.

In some implementations, the first reference voltage may be a disconnection diagnosis reference voltage that is a reference voltage for determining whether or not disconnection diagnosis starts, and the second reference voltage may be a low voltage diagnosis reference voltage that is a reference voltage for determining whether or not low voltage diagnosis starts.

In some implementations, when the cell voltage is maintained for a preset second reference time or more while being less than a lower limit threshold voltage that is one of the diagnosis start condition, the processor may diagnose that the battery is at a low voltage.

In some implementations, when the processor determines that the cell voltage does not satisfy the diagnostic condition, the processor may perform low voltage diagnosis with respect to the battery on the basis of a minimum cell voltage.

In some implementations, when the minimum cell voltage is maintained for a third reference time or more while being less than an upper limit threshold voltage that is one of the diagnosis start condition, the processor may diagnose that the battery is at a low voltage state.

In some implementations, an apparatus for diagnosing a battery of a vehicle may include: a voltage sensor measuring voltage with respect to a plurality of battery cells in the battery; and a processor performing low voltage diagnosis with respect to the battery on the basis of a cell voltage measured by the voltage sensor.

In some implementations, the processor may include: a first diagnosis module diagnosing that the battery is at a low voltage state, when the cell voltage satisfies a preset condition; and a second diagnosis module diagnosing independently operated from the first diagnosis module, and when a minimum cell voltage among a plurality of cell voltages satisfies the preset condition, the second diagnosis module diagnosing that the battery is at a low voltage state.

In some implementations, when the cell voltage is maintained for a preset first reference time while satisfying a diagnosis start voltage condition, the first diagnosis module may determine that a diagnosis start condition is satisfied.

In some implementations, when the cell voltage is equal to or greater than a first reference voltage and less than or equal to a second reference voltage, the first diagnosis module may determine that the diagnosis start voltage condition is satisfied.

In some implementations, in state when the diagnosis start condition is satisfied, when the first diagnosis module determines that the cell voltage is maintained for a preset second reference time or more while being less than the first reference voltage, the first diagnosis module may diagnose that the battery is at a low voltage state.

In some implementations, in state when the diagnosis start condition is satisfied, when the cell voltage is equal to or greater than the first reference voltage, the first diagnosis module may determine whether or not the minimum cell voltage satisfies the preset condition, and when the minimum cell voltage satisfies the preset condition, the first diagnosis module may diagnose that the battery is at a low voltage state.

In some implementations, a satisfactory condition by which the first diagnosis module diagnoses that the battery is at a low voltage state and a satisfactory condition by which the second diagnosis module diagnoses that the battery is at a low voltage state may be equal to each other.

In some implementations, when it is determines that the minimum cell voltage is maintained for a preset third reference time while being less than the second reference voltage, the first diagnosis module and the second diagnosis module may diagnose that the battery is at a low voltage state.

In some implementations, a vehicle battery diagnostic method performed by a processor on the basis of a plurality of cell voltages measured by a voltage sensor may include: monitoring the plurality of cell voltages; determining whether or not the cell voltage satisfies a diagnosis start condition; determining, when the cell voltage satisfies the diagnosis start condition, whether or not the cell voltage satisfies a preset diagnostic condition; and diagnosing, when the cell voltage satisfies the diagnostic condition, that the battery is at a low voltage state.

In some implementations, the determining of whether or not the diagnosis start condition is satisfied may include determining that the cell voltage satisfies the diagnosis start condition, when the cell voltage is maintained for a preset first reference time or more while being equal to or greater than a first reference voltage and less than or equal to a second reference voltage.

In some implementations, the determining of whether or not the diagnostic condition is satisfied may include determining that the cell voltage satisfies the diagnostic condition, when the cell voltage is maintained for a preset second reference time or more while being less than the first reference voltage.

In some implementations, the vehicle battery diagnostic method may include: determining, when the cell voltage does not satisfy the diagnostic condition, whether or not a minimum cell voltage is maintained for a preset third reference time or more while being less than the second reference voltage.

In some implementations, the vehicle battery diagnostic method may include: regardless of the diagnosis start condition, performing low voltage diagnosis with respect to the battery on the basis of a minimum cell voltage.

In some implementations, a vehicle system may include: a battery; a load operated based on energy supplied from the battery; a relay disposed between the battery and the load.

In some implementations, the battery diagnostic apparatus may turn off the relay when diagnosing that the battery is at a low voltage state.

Specific details according to various examples of the present disclosure, other than the solutions mentioned above, are included in the description and the drawings below.

According to another aspect of the present disclosure, there can be provided the apparatus for diagnosing a battery of a vehicle, the apparatus being capable of diagnosing low voltage of a vehicle battery, the battery diagnostic method, and the vehicle system including the same.

According to another aspect of the present disclosure, the disconnection diagnosis reference voltage (e.g., 0.5V) and the low voltage diagnosis reference voltage (e.g., 1.5V) are preset as the diagnosis entry condition (or diagnosis start condition), so that both of low voltage diagnosis and disconnection diagnosis with respect to the battery can be performed.

According to another aspect of the present disclosure, when the battery cell voltage satisfies the diagnosis entry condition, regardless of a result of disconnection diagnosis (voltage sensing abnormality diagnosis), low voltage diagnosis is performed so that reliability with respect to low voltage diagnosis can be improved.

The conventional low voltage diagnosis technique may diagnose that the battery is at a low voltage state when a situation where the battery cell voltage is less than 1.5V is maintained for 5 seconds. However, the low voltage diagnostic technology of the present disclosure can maintain the conventional low voltage diagnostic process and can perform the low voltage diagnosis even when battery cell voltage satisfies the voltage condition of the disconnection diagnosis entry condition. Therefore, reliability in low voltage diagnosis can be improved.

In some implementations, a holding reference time of the low voltage diagnosis reference is preset shorter than the conventional low voltage diagnostic technology. Therefore, the present disclosure can perform diagnosis even for respect to low voltage not to be a diagnostic object in the conventional low voltage diagnostic technology, and can improve the reliability in low voltage diagnosis.

As described above, the reliability in the low voltage diagnosis can be improved when the low voltage diagnostic technology of the present disclosure is used. Accordingly, over-discharging and intensified cell swelling can be prevented, and occurrence of fire is prevented and thus ensure the safety of electric vehicles.

The effect of the present disclosure is not limited to the abovementioned, and other effects not mentioned will be clearly understood by those skilled in the art from the description below.

Since the contents of the objectives to be solved, the solution for the objectives, and the effects mentioned above do not specify the essential features of the claims, the right scope of the claims is not limited by the matters described in the contents of the present disclosure.

DETAILED DESCRIPTION

Figure 1:
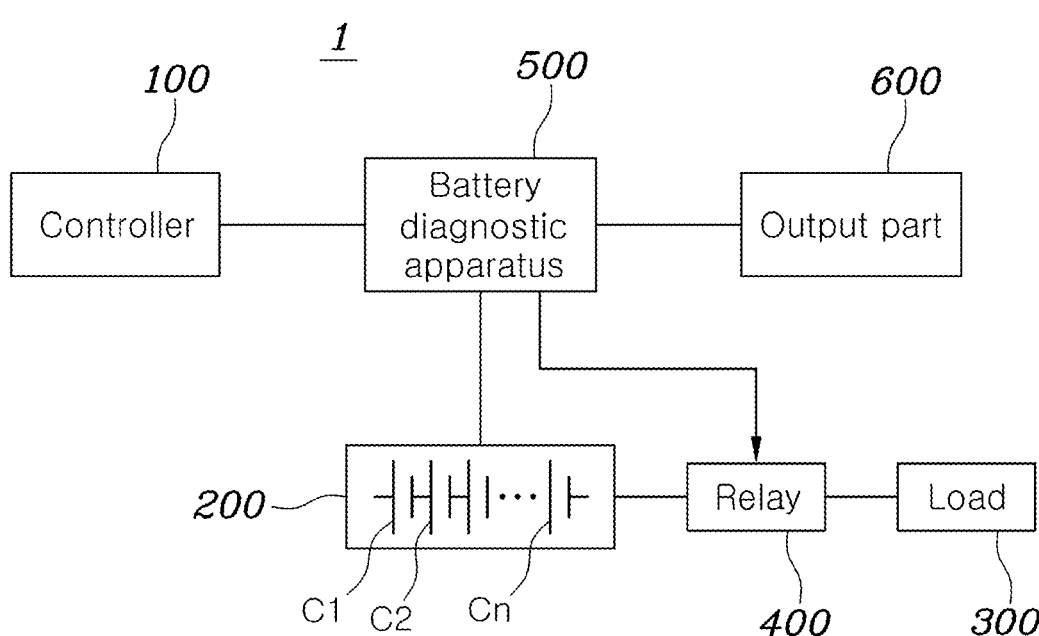
FIG. 1 is a view showing an example of a vehicle system 1.

FIG. 1 is a view showing configuration of a vehicle system 1.

Referring to FIG. 1, the vehicle system 1 may include a controller 100, a battery 200, a load 300, a relay 400, a battery diagnostic apparatus 500, and an output part 600, and configuration of the vehicle system 1 is not limited thereto.

In some implementations, the vehicle system 1 may be applied to an electric vehicle, and examples of an electric vehicle include an EV (Electric Vehicle), an HEV (Hybrid Electric Vehicle), a PHEV (Plug-in Hybrid Electric Vehicle), fuel cell vehicles, etc.

The controller 100 controls overall operation of a vehicle, for example, may be implemented as a vehicle control unit (VCU).

In some implementations, the controller 100 may output information about vehicle conditions (vehicle condition information). For example, when a vehicle is in a power-ON condition, the controller 100 may output a vehicle power ON signal (IG_ON).

The controller 100 may receive related information to the battery 200 through communication of the battery diagnostic apparatus 500 (battery information), and may control operation of the vehicle on the basis of the battery information.

The controller 100 may receive a battery diagnostic result from the battery diagnostic apparatus 500, and may perform a following-up measures according to diagnosis. For example, the controller 100 may output an abnormal diagnosis through a warning system. For example, the warning system may include a display system, a sound system, a warning lamp, etc.

The battery 200 may be a high voltage battery of a vehicle to supply energy to the load 300 generating power of the vehicle, or to be charged by receiving energy by recovery of the load 300.

The battery 200 may include a plurality of battery cells (C1 to Cn). The plurality of battery cells (C1 to Cn) may be implemented in one module (battery module), and the battery 200 may be implemented in a pack form including a plurality of battery modules. For example, the battery 200 may be expressed in 'a battery module' or 'a battery pack'.

The load 300 may be a motor system generating power of a vehicle with energy supplied from the battery 200. For example, the load 300 may include an inverter converting power supplied from the battery 200 into power suitable for a driving motor, and the driving motor driven based on power supplied from the inverter and generating power.

The relay 400 may be disposed between the battery 200 and the load 300. For example, the relay 400 may be disposed on a power movement path between the battery 200 and the load 300.

In some implementations, the relay 400 may be switched according to control of the battery diagnostic apparatus 500. The relay 400 may allow power movement between the battery 200 and the load 300 at turn-on, and may block power movement between the battery 200 and the load 300 at turn-off.

The battery diagnostic apparatus 500 may be performed diagnosis with respect to the battery 200 on the basis of monitoring the battery 200.

For example, the battery diagnostic apparatus 500 may be implemented by a battery management system (BMS).

When receiving the vehicle power ON signal (IG_ON) from the controller 100, the battery diagnostic apparatus 500 may start diagnosis with respect to the battery 200.

In some implementations, the battery diagnostic apparatus 500 may perform low voltage diagnosis with respect to the battery 200 on the basis of monitoring of a voltage of battery cells C1 to Cn in the battery 200 (a battery cell voltage or a cell voltage).

Furthermore, the battery diagnostic apparatus 500 may perform disconnection diagnosis (or voltage sensing abnormality diagnosis) with respect to the battery 200 on the basis of voltage monitoring of battery cells C1 to Cn in.

In some implementations, when the battery diagnostic apparatus 500 determines abnormality diagnosis with respect to the battery 200, i.e., when the battery diagnostic apparatus 500 diagnoses that abnormality occurs in the battery 200, the battery diagnostic apparatus 500 may turn off the relay 400.

When the battery diagnostic apparatus 500 diagnoses that abnormality occurs in the battery 200, the battery diagnostic apparatus 500 may provide an abnormality diagnosis result to the output part 600.

The battery diagnostic apparatus 500 may provide a diagnostic result (including an abnormality diagnostic result) with respect to the battery 200 to the controller 100.

The output part 600 may output the abnormality diagnostic result provided from the battery diagnostic apparatus 500 in a preset method.

For example, the output part 600 may include the display system, the sound system, the warning lamp, etc. so as to output abnormality diagnosis with combination of graphics, text, voice, and warning light indicators. These configurations may be provided in a vehicle cluster, or may be provided outside a vehicle cluster.

The present disclosure is technically intended to overcome diagnostic limitations of the conventional low voltage diagnostic technique, and accordingly, description will focus on the case where low voltage is diagnosed.

Figure 2:
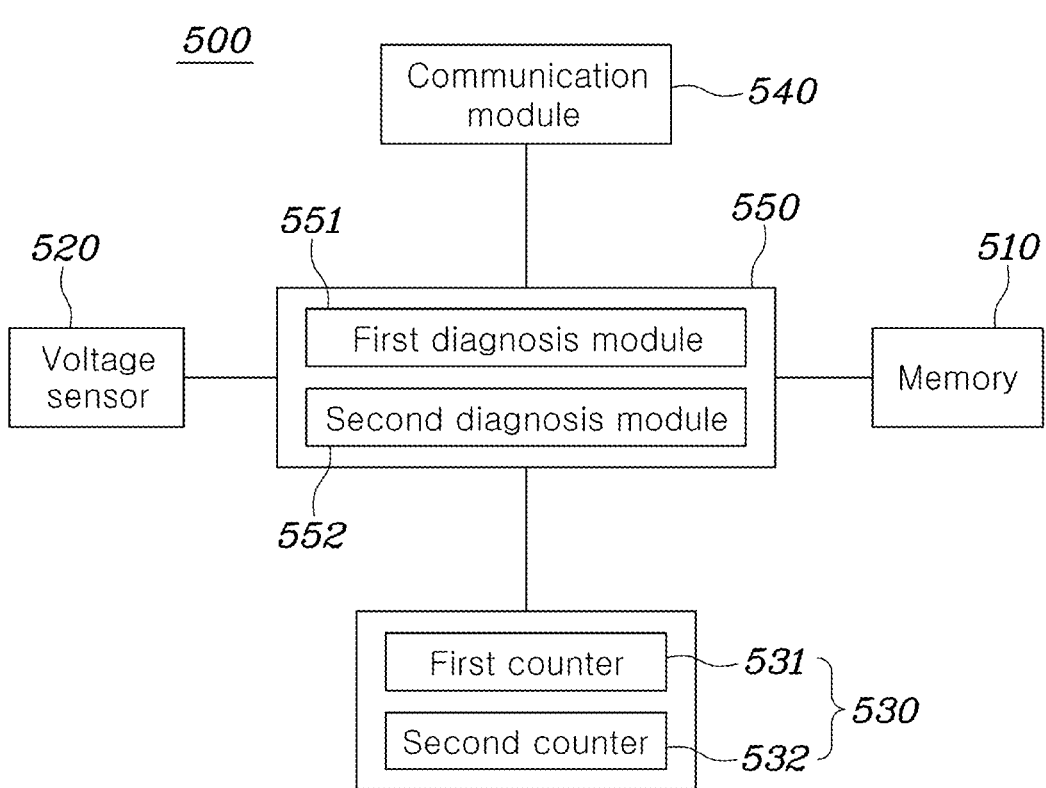
FIG. 2 is a view showing an example of the battery diagnostic apparatus 500.

FIG. 2 is a view showing configuration of the battery diagnostic apparatus 500.

In some implementations, the battery diagnostic apparatus 500 may be implemented to perform reliable diagnosis with respect to a low voltage of the battery 200.

In some implementations, the battery diagnostic apparatus 500 may be implemented to perform low voltage diagnosis and disconnection diagnosis with respect to the battery 200 by determining whether or not diagnosis starts on the basis of a disconnection diagnosis reference voltage (e.g., 0.5V) and a low voltage diagnosis reference voltage (e.g., 1.5V).

In some implementations, when the battery cell voltage satisfies the diagnosis entry condition, the battery diagnostic apparatus 500 may be implemented to perform low voltage diagnosis regardless of a result of the disconnection diagnosis.

Referring to FIGS. 1 and 2, the battery diagnostic apparatus 500 may include a memory 510, a voltage sensor 520, a counter 530, a communication module 540, and a processor 550 (or diagnosis processor), configuration of the battery diagnostic apparatus 500 is not limited thereto.

The memory 510 may store algorithm (or program) required for the processor 550 to perform diagnosis for the battery 200, a preset reference value, algorithm of a response when abnormality is diagnosed, etc.

The voltage sensor 520 may be connected to an output terminal of the battery 200 and measure a voltage (a battery voltage) output from the battery 200.

The voltage sensor 520 may measure a voltage (a battery cell voltage or a cell voltage) of each of the plurality of battery cells C1 to Cn in the battery 200. For example, the voltage sensor 520 may be disposed at the side of the battery 200.

The voltage sensor 520 may provide a battery voltage, a battery cell voltage (or a cell voltage) to the processor 550.

For example, the voltage sensor 520 may perform communication with the processor 550 by a communication method such as serial peripheral interface (SPI) communication in the daisy-chain method, controller area network (CAN) communication, local interconnect network (LIN) communication.

The counter 530 performs count operation according to control of the processor 550, and may output a count signal to the processor 550 for each preset period (e.g., 0.1 second).

The counter 530 may be used when the processor 550 determines time for a predetermined voltage to be maintained.

The communication module 540 may be provided for communication with the controller 100. For example, the communication module 540 may receive vehicle condition information transmitted from the controller 100, and may transmit the received vehicle condition information to the processor 550. At this point, the vehicle condition information may include the vehicle power ON signal (IG_ON).

The communication module 540 may transmit battery information transmitted from the processor 550 (including a battery voltage, a battery cell voltage, etc.), the battery diagnosis result information, etc. to the controller 100.

The processor 550 performs overall operation of the battery diagnostic apparatus 500, and may perform diagnosis with respect to the battery 200. In some implementations, the processor 550 may perform low voltage diagnose with respect to the battery 200.

The processor 550 may perform diagnosis with respect to the battery 200 one the basis of the algorithm, the reference values, etc. stored in the memory 510. The processor 550 may monitor a plurality of battery cell voltages provided from the voltage sensor 520.

When receiving the vehicle power ON signal (IG_ON) from the controller 100, the processor 550 may start monitoring with respect to the battery 200.

The processor 550 may monitor the battery cell voltage (or the cell voltage) provided from the voltage sensor 520, and may determine whether or not diagnosis starts on the basis of the cell voltage. At this point, the processor 550 may determine whether or not the cell voltage Vc satisfies the diagnosis start condition.

In some implementations, when the cell voltage Vc is maintained for a preset first reference time t_ref1 or more while satisfying the diagnosis start voltage condition and satisfying the diagnosis start voltage condition (when the diagnosis start time condition is satisfied), the processor 550 may start diagnosis with respect to the battery 200.

In some implementations, the cell voltage Vc is equal to or greater than a first reference voltage Vref1 (V_ref1≤Vc) and the cell voltage Vc is less than or equal to a second reference voltage V_ref2 (Vc≤V_ref2), the processor 550 may determine that the cell voltage Vc satisfies the diagnosis start voltage condition.

In some implementations, the first reference voltage V_ref1 may be a disconnection diagnosis reference voltage (e.g., 0.5V), and the second reference voltage V_ref2 may be a low voltage diagnosis reference voltage (e.g., 1.5V).

At this point, the disconnection diagnosis reference voltage may mean a reference voltage for determining whether or not disconnection diagnosis starts, and the low voltage diagnosis reference voltage may mean a reference voltage for determining whether or not low voltage diagnosis starts.

Therefore, the first reference voltage V_ref1 may be a lower limit threshold voltage of a diagnosis start voltage condition used for determining whether or not diagnosis starts, and the second reference voltage V_ref2 may be an upper limit threshold voltage of a diagnosis start voltage condition used for determining whether or not diagnosis starts.

Likewise, the disconnection diagnosis reference voltage (e.g., 0.5V) and the low voltage diagnosis reference voltage (e.g., 1.5V) are preset as the diagnosis start condition, so that low voltage diagnosis and disconnection diagnosis with respect to the battery 200 may be possible.

When it is determined that the cell voltage Vc satisfies the diagnosis start voltage condition (V_ref1≤Vc≤V_ref2), the processor 550 may operate the counter 530, and may determine whether or not the cell voltage Vc is maintained for the first reference time t_ref1 (e.g., 0.3 seconds) or more (whether or not diagnosis start time condition is satisfied) on the basis of a count signal output from the counter 530.

At this point, operating, by the processor 550, the counter 530 may include resetting the counter 530.

When the cell voltage Vc satisfies the diagnosis start condition, the processor 550 may perform primary low voltage diagnosis by determining whether or not the cell voltage Vc satisfies the diagnostic condition.

In some implementations, when the cell voltage Vc is maintained for a preset second reference time t_ref2 (e.g., 0.7 seconds) while being less than the first reference voltage V_ref1 (Vc<V_ref1), the processor 550 may diagnose that the battery 200 is at a low voltage.

When it is determined that the cell voltage Vc is less than the first reference voltage V_ref1 (Vc<V_ref1), the processor 550 may operate the counter 530 and may determine whether or not the cell voltage Vc is maintained for the second reference time t_ref2 (e.g., 0.7 seconds) on the basis of a count signal output from the counter 530.

When the cell voltage Vc is equal to or greater than the first reference voltage V_ref1 (V_ref2≤Vc), the processor 550 may perform secondary low voltage diagnosis.

In some implementations, when among monitored cell voltage Vc, the minimum cell voltage Vc_min is maintained for a preset third reference time t_ref3 (e.g., 1 second) while being less than the second reference voltage V_ref2, the processor 550 may diagnose that the battery 200 is at a low voltage state.

When it is determined that the minimum cell voltage Vc_min is less than the second reference voltage V_ref2, the processor 550 may operate the counter 530 and may determine whether or not the minimum cell voltage Vc_min is maintained for the third reference time t_ref3 (e.g., 1 second) or more, on the basis of a count signal output from the counter 530.

Meanwhile, the processor 550 does not determine whether or not diagnosis starts and may diagnose low voltage of the battery 200 on the basis of the minimum cell voltage Vc_min among the monitored cell voltage Vc.

Accordingly, when among monitored cell voltage Vc, the minimum cell voltage Vc_min is maintained for the preset third reference time t_ref3 (e.g., 1 second) while being less than the second reference voltage V_ref2, the processor 550 may diagnose that the battery 200 is at a low voltage.

As described above, the processor 550 performs low voltage diagnosis with respect to the battery 200 after determining whether or not diagnosis starts on the basis of the cell voltage Vc, and regardless of determination of whether or not diagnosis starts, the processor 550 may perform low voltage diagnosis with respect to the battery 200 on the basis of the minimum cell voltage Vc_min.

To this end, the processor 550 may include a first diagnosis module 551 determining whether or not diagnosis starts on the basis of the cell voltage Vc and then performing low voltage diagnosis with respect to the battery 200, and a second diagnosis module 552 performing low voltage diagnosis with respect to the battery 200 on the basis of the minimum cell voltage Vc_min regardless of determination of whether or not diagnosis starts.

Furthermore, the counter 530 may include a first counter 531 operated in response to the first diagnosis module 551 and outputting a count signal (or first count signal) to the first diagnosis module 551, and a second counter 532 operated in response to the second diagnosis module 552 and outputting a count signal (or second count signal) to the second diagnosis module 552.

In some implementations, when it is determined that the battery 200 is at a low voltage state, the processor 550 may output an off signal to the relay 400 disposed between the battery 200 and the load 300 and turn off the relay 400.

Furthermore, the processor 550 may provide a low voltage diagnosis result to the output part 600 and may allow the output part 600 to output an alarm corresponding to the low voltage diagnosis result. Furthermore, the processor 550 may provide a low voltage diagnosis result to the controller 100 through the communication module 540.

At this point, depending on a diagnosis result, each of the first diagnosis module 551 and the second diagnosis module 552 may independently turn off the relay 400, and may output a low voltage diagnosis result to the controller 100 and the output part 600.

Figure 3:
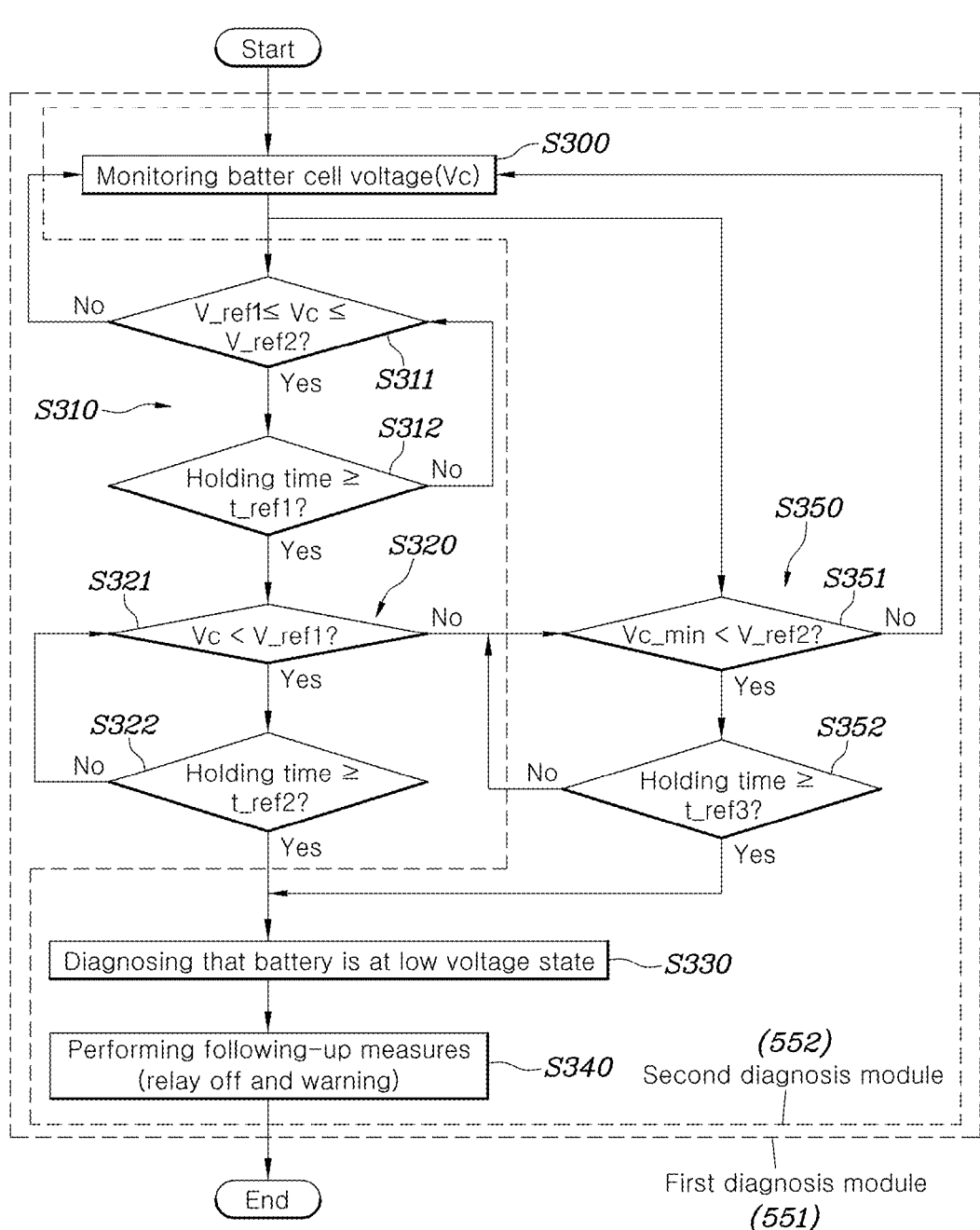
FIG. 3 is a view showing an example of a vehicle battery diagnostic method.

FIG. 3 is a view showing a vehicle battery diagnostic method.

Phased operations shown in FIG. 3 may be performed by the apparatus 500 for diagnosing a battery of a vehicle, described with reference to FIGS. 1 and 2.

Referring to FIGS. 1 to 3, the battery diagnostic apparatus 500 may monitor a battery cell voltage Vc on the basis of a battery cell voltage Vc measured using the voltage sensor 520, at S300.

For example, when receiving the vehicle power ON signal IG_ON provided from the controller 100, the battery diagnostic apparatus 500 may start monitoring the battery cell voltage Vc.

Thereafter, each of the first and second diagnosis modules 551 and 552 of the battery diagnostic apparatus 500 may independently perform diagnosis with respect to the battery 200 on the basis of the battery cell voltage Vc.

First, a process in which the first diagnosis module 551 performs diagnosis for the battery 200 will be described.

The first diagnosis module 551 may determine whether or not diagnosis starts, on the basis of the battery cell voltage Vc, S310.

At S310, the first diagnosis module 551 may determine that the battery cell voltage Vc satisfies the diagnosis start condition.

At this point, the first diagnosis module 551 may determine whether or not the battery cell voltage Vc is maintained for the preset first reference time t_ref1 or more while satisfying the diagnosis start voltage condition (V_ref1≤Vc≤V_ref2).

Specifically, the first diagnosis module 551 may determine that the battery cell voltage Vc satisfies a condition of being equal to or greater than the first reference voltage Vref1 (V_ref1≤Vc) and less than or equal to the second reference voltage V_ref2 ((Vc≤V_ref2), S311.

At S311, when the first diagnosis module 551 determines that the battery cell voltage Vc does not satisfy the diagnosis start voltage condition, S311—No, the first diagnosis module 551 may continue to monitor the battery cell voltage Vc, S300.

At S311, when the first diagnosis module 551 determines that the battery cell voltage Vc satisfies the diagnosis start voltage condition, S311—Yes, the first diagnosis module 551 may determine whether or not a holding time of the battery cell voltage Vc is equal to or longer than the first reference time t_ref1, S312.

At this point, the first diagnosis module 551 operates the first counter 531, and may determine that a holding time of the battery cell voltage Vc is equal to or longer than the first reference time t_ref1, on the basis of the first count signal output from the first counter 531.

At S312, when the first diagnosis module 551 determines that a holding time of the battery cell voltage Vc is less than the first reference time t_ref1, S312—No, the first diagnosis module 551 may determine whether or not the battery cell voltage Vc satisfies the diagnosis start voltage condition, S311.

At S312, when the first diagnosis module 551 determines that a holding time of the battery cell voltage Vc is equal to or longer than the first reference time t_ref1, S312—Yes, the first diagnosis module 551 may determine that the battery cell voltage Vc satisfies the diagnosis start condition and may perform primary low voltage diagnosis on the basis of the diagnostic condition, S320.

Specifically, when it is determined that a holding time of the battery cell voltage Vc is equal to or longer than the first reference time t_ref1 (S312—Yes), the first diagnosis module 551 may determine whether or not the battery cell voltage Vc is maintained for the preset second reference time t_ref2 or more while being less than the first reference voltage V_ref1 (Vc<V_ref1), S320.

Specifically, the first diagnosis module 551 may determine whether or not the battery cell voltage Vc is less than the first reference voltage V_ref1 (Vc<V_ref1), S321.

At S321, when it is determined that the battery cell voltage Vc is less than the first reference voltage V_ref1 (Vc<V_ref1), S321—Yes, the first diagnosis module 551 may determine whether or not a holding time of the battery cell voltage Vc is equal to or longer than the second reference time t_ref2, S322.

At this point, the first diagnosis module 551 may operate the first counter 531, and may determine whether or not a holding time of the battery cell voltage Vc is equal to or longer than the second reference time t_ref2, on the basis of the first count signal output from the first counter 531.

At S322, when it is determined that a holding time of the battery cell voltage Vc is less than the second reference time t_ref2, S322—No, the first diagnosis module 551 may determine whether or not the battery cell voltage Vc is less than the first reference voltage V_ref1 (Vc<V_ref1), S321. At S322, when it is determined that a holding time of the battery cell voltage Vc is longer than the second reference time t_ref2, S322—Yes, the first diagnosis module 551 may diagnose that the battery 200 is at a low voltage state, S330, and may perform a following-up measure, S340.

At S340, the first diagnosis module 551 may output an off signal to the relay 400 disposed between the battery 200 and the load 300 to turn off the relay 400.

Furthermore, at S340, the first diagnosis module 551 may provide a result of the low voltage diagnosis to the output part 600 to allow the output part 600 to output a warning in response to the result of the low voltage diagnosis, and may provide the result of the low voltage diagnosis to the controller 100 through the communication module 540.

Meanwhile, at S321, when it is determined that the battery cell voltage Vc is equal to or greater than the first reference voltage V_ref1, S321—No, the first diagnosis module 551 may perform secondary low voltage diagnosis, S350.

When it is determined that the battery cell voltage Vc is equal to or greater than the first reference voltage V_ref1, S321—No, the first diagnosis module 551 may determine whether or not the minimum battery cell voltage Vc_min among the battery cell voltage Vc is maintained for the third reference time t_ref3 or more while being less than the second reference voltage V_ref2, S350.

Specifically, the first diagnosis module 551 may determine whether or not the minimum battery cell voltage Vc_min is less than the second reference voltage V_ref2, S351.

At S351, when it is determined that the minimum battery cell voltage Vc_min is equal to or greater than the second reference voltage V_ref2, S351—No, the first diagnosis module 551 may continue to monitor the battery cell voltage Vc, S300. At S351, when it is determined that the minimum battery cell voltage Vc_min is less than the second reference voltage V_ref2, S351—Yes, the first diagnosis module 551 may determine whether or not a holding time of the minimum battery cell voltage Vc_min is equal to or longer than the third reference time t_ref2, S352.

At this point, the first diagnosis module 551 may operate the first counter 531, and may determine whether or not a holding time of the minimum battery cell voltage Vc_min is equal to or longer than the third reference time t_ref3, on the basis of the first count signal output from the first counter 531.

At S352, when it is determined that a holding time of the battery cell voltage Vc_min is less than the third reference time t_ref3, S352—No, the first diagnosis module 551 may determine whether or not the minimum battery cell voltage Vc_min is less than the second reference voltage V_ref2, S351.

At S352, when it is determined that a holding time of the minimum battery cell voltage Vc-min is longer than the third reference time t_ref3, S352—Yes, the first diagnosis module 551 may diagnose that the battery 200 is at a low voltage state, S330, and may perform a following-up measure, S340.

Next, a process in which the second diagnosis module 552 perform diagnosis for the battery 200 will be described.

The second diagnosis module 552 does not perform the steps at S310 and S320 that are performed by the first diagnosis module 551, and is operated according to the step of S350 to perform diagnosis for the battery 200.

Specifically, the second diagnosis module 552 may determine whether or not the minimum battery cell voltage Vc_min among the battery cell voltage Vc is maintained for the preset third reference time t_ref3 or more while being less than the second reference voltage V_ref2, S350.

Specifically, the second diagnosis module 552 may determine whether or not the minimum battery cell voltage Vc_min is less than the second reference voltage V_ref2, S351.

At S351, when it is determined that the minimum battery cell voltage Vc_min is equal to or greater than the second reference voltage V_ref2, S351—No, the second diagnosis module 552 may continue to monitor the battery cell voltage Vc, S300.

At S351, when it is determined that the minimum battery cell voltage Vc_min is less than the second reference voltage V_ref2, S351—Yes, the second diagnosis module 552 may determine whether or not a holding time of the minimum battery cell voltage Vc_min is equal to or longer than the third reference time t_ref2, S352.

At this point, the second diagnosis module 552 may operate the second counter 532, and may determine whether or not a holding time of the minimum battery cell voltage Vc_min is equal to or longer than the third reference time t_ref3, on the basis of the second count signal output from the second counter 532.

At S352, when it is determined that a holding time of the battery cell voltage Vc_min is less than the third reference time t_ref3, S352—No, the second diagnosis module 552 may determine whether or not the minimum battery cell voltage Vc_min is less than the second reference voltage V_ref2, S351.

At S352, when it is determined that a holding time of the minimum battery cell voltage Vc-min is longer than the third reference time t_ref3, S352—Yes, the second diagnosis module 552 may diagnose that the battery 200 is at a low voltage state, S330, and may perform a following-up measure, S340.

According to the vehicle battery diagnostic technology of the present disclosure, the apparatus 500 for diagnosing a battery of a vehicle may determine whether or not the cell voltage Vc satisfies the preset diagnostic condition when the cell voltage Vc satisfies the diagnosis start condition, and may diagnose that the battery 200 is at a low voltage state when the cell voltage Vc satisfies the diagnostic condition.

According to the implementations of present disclosure, the apparatus 500 for diagnosing a battery of a vehicle may determine that the cell voltage Vc satisfies the diagnosis start condition when the cell voltage Vc is maintained for the preset first reference time t_ref1 or more while satisfying the diagnosis start voltage condition.

According to the implementations of the present disclosure, the apparatus 500 for diagnosing a battery of a vehicle may determine that the cell voltage Vc satisfies the diagnosis start voltage condition, when the cell voltage Vc is equal to or greater than the first reference voltage V_ref1 and less than or equal to the second reference voltage V_ref2.

According to the implementations of the present disclosure, the apparatus 500 for diagnosing a battery of a vehicle may diagnose that the battery 200 is at a low voltage state when the cell voltage Vc is maintained for the preset second reference time t_ref2 or more while being less than the lower limit threshold voltage that is one of the diagnosis start condition.

According to the implementations of the present disclosure, the apparatus 500 for diagnosing a battery of a vehicle may perform low voltage diagnosis with respect to the battery 200 on the basis of the minimum cell voltage Vc_min when the cell voltage Vc does not satisfy the diagnostic condition.

According to the implementations of the present disclosure, the apparatus 500 for diagnosing a battery of a vehicle may diagnose that the battery 200 is at a low voltage state when the minimum cell voltage Vc_min is maintained for the preset third reference time t_ref3 or more while being less than the upper limit threshold voltage that is one of the diagnosis start condition.

According to the vehicle battery diagnose technology according to the implementations of the present disclosure, the processor 550 of the apparatus 500 for diagnosing a battery of a vehicle may include: the first diagnosis module 551 diagnosing that the battery 200 is at a low voltage state when the cell voltage Vc satisfies the preset condition; and the second diagnosis module 552 operated independently from the first diagnosis module 551, and diagnosing that the battery 200 is at a low voltage state when the minimum cell voltage VC_min among the plurality of cell voltages Vc satisfies the preset condition.

According to the implementations of the present disclosure, the first diagnosis module 551 may determine that the cell voltage Vc satisfies the diagnosis start condition, when the cell voltage Vc is maintained for the preset first reference time t_ref1 or more while satisfying the diagnosis start voltage condition.

According to the implementations of the present disclosure, the first diagnosis module 551 may determine that the cell voltage Vc satisfies the diagnosis start voltage condition is satisfied, when the cell voltage Vc is equal to or greater than the first reference voltage V_ref1 and less than or equal to the second reference voltage V_ref2.

According to the implementations of the present disclosure, in case where the diagnosis start condition is satisfied, when the first diagnosis module 551 determines that the cell voltage Vc is maintained for the preset second reference time t_ref2 or more while being less than the first reference voltage V_ref1, the first diagnosis module 551 may diagnose that the battery 200 is at a low voltage state.

According to the implementations of the present disclosure, in case where the diagnosis start condition is satisfied, the first diagnosis module 551 determines whether or not the minimum cell voltage Vc_min satisfies the preset condition when the cell voltage Vc is equal to or greater than the first reference voltage V_ref1, and the first diagnosis module 551 may diagnose that the battery 200 is at a low voltage state when the minimum cell voltage Vc_min satisfied the preset condition.

According to the implementations of the present disclosure, a satisfactory condition by which the first diagnosis module 551 diagnoses that the battery 200 is at a low voltage state and the satisfactory condition by which the second diagnosis module 552 diagnoses that the battery 200 is at a low voltage state are equal to each other.

According to the implementations of the present disclosure, the first diagnosis module 551 and the second diagnosis module 552 may diagnose that the battery 200 is at a low voltage state, when it is determined that the minimum cell voltage Vc_min is maintained for the third reference time t_ref3 or more while being less than the second reference voltage V_ref2.

The invention claimed is:

1. An apparatus for diagnosing a battery of a vehicle, the apparatus comprising:

a voltage sensor configured to measure voltage of each of a plurality of battery cells within the battery; and a processor configured to perform low voltage diagnosis with respect to the battery based on a cell voltage measured by the voltage sensor, wherein the processor is configured to:

determine, based on the cell voltage satisfying a diagnosis start condition, whether the cell voltage satisfies a preset diagnostic condition, and determine, based on the cell voltage satisfying the preset diagnostic condition, that the battery is at a low voltage state, wherein the processor is further configured to:

determine that the cell voltage satisfies the diagnosis start condition, based on the cell voltage being (i) maintained at or greater than a first reference time and (ii) greater than or equal to a first reference voltage and less than or equal to a second reference voltage, determine that the battery satisfies the preset diagnostic condition, based on the cell voltage being (i) maintained at or greater than a preset second reference time and (ii) less than the first reference voltage, and determine that the battery is at the low voltage state based on the preset diagnostic condition being satisfied.

2. The apparatus of claim 1, wherein the first reference voltage is a disconnection diagnosis reference voltage that is a reference voltage for determining initiation of disconnection diagnosis, and wherein the second reference voltage is a low voltage diagnosis reference voltage that is a reference voltage for determining initiation of low voltage diagnosis.

3. The apparatus of claim 1, wherein the processor is configured to, based on a determination that the cell voltage does not satisfy the diagnostic condition, perform the low voltage diagnosis with respect to the battery based on a minimum cell voltage measured by the voltage sensor.

4. The apparatus of claim 3, wherein the processor is configured to, based on the minimum cell voltage being (i) maintained at or greater than a third reference time and (ii) less than an upper limit threshold voltage, determine that the battery is at the low voltage state, and wherein the minimum cell voltage being less than the upper limit threshold voltage is a condition included in the diagnosis start condition.

5. An apparatus for diagnosing a battery of a vehicle, the apparatus comprising:

a voltage sensor configured to measure voltage of each of a plurality of battery cells within the battery; and a processor configured to perform low voltage diagnosis with respect to the battery based on a cell voltage measured by the voltage sensor, wherein the processor comprises:

a first diagnosis module configured to, based on the cell voltage satisfying a preset condition, determine that the battery is at a low voltage state, and a second diagnosis module configured to (i) operate independently from the first diagnosis module and, (ii) based on a minimum cell voltage among voltages of the plurality of cells satisfying the preset condition, determine that the battery is at the low voltage state, wherein first diagnosis module is further configured to:

determine that the cell voltage satisfies the diagnosis start condition, based on the cell voltage being (i) maintained at or greater than a first reference time and (ii) greater than or equal to a first reference voltage and less than or equal to a second reference voltage, determine that the battery satisfies the preset diagnostic condition, based on the cell voltage being (i) maintained at or greater than a preset second reference time and (ii) less than the first reference voltage, and determine that the battery is at the low voltage state based on the preset diagnostic condition being satisfied.

6. The apparatus of claim 5, wherein the first diagnosis module is configured to:

based on the diagnosis start condition being satisfied and the cell voltage being equal to or greater than the first reference voltage, determine whether the minimum cell voltage satisfies the preset condition, and based on the minimum cell voltage satisfying the preset condition determine, determine that the battery is at the low voltage state.

7. The apparatus of claim 6, wherein a satisfactory condition by which the first diagnosis module determines that the battery is at the low voltage state and a satisfactory condition by which the second diagnosis module diagnoses that the battery is at the low voltage state are equal to each other.

8. The apparatus of claim 7, wherein the first diagnosis module and the second diagnosis module are configured to, based on a determination that the minimum cell voltage is (i) maintained at a preset third reference time and (ii) less than the second reference voltage, determine that the battery is at the low voltage state.

9. A vehicle battery diagnostic method performed by a processor based on a plurality of cell voltages measured by a voltage sensor, comprising:

monitoring the plurality of cell voltages;

determining whether a cell voltage among the plurality of cell voltages satisfies a diagnosis start condition;

determining, based on the cell voltage satisfying the diagnosis start condition, whether the cell voltage satisfies a preset diagnostic condition; and determining, based on the cell voltage satisfying the diagnostic condition, that the battery is at a low voltage state, wherein determining whether the diagnosis start condition is satisfied comprises:

determining, based on the cell voltage being (i) maintained at or greater than a preset first reference time and (ii) equal to or greater than a first reference voltage and less than or equal to a second reference voltage, that the cell voltage satisfies the diagnosis start condition, and wherein determining whether the diagnostic condition is satisfied comprises:

determining, based on the cell voltage being (i) maintained at or greater than a preset second reference time and (ii) less than the first reference voltage, that the cell voltage satisfies the diagnostic condition.

10. The vehicle battery diagnostic method of claim 9, further comprising:

determining, based on the cell voltage not satisfying the diagnostic condition, whether a minimum cell voltage is maintained at or greater than a preset third reference time while being less than the second reference voltage.

11. The vehicle battery diagnostic method of claim 9, further comprising:

performing low voltage diagnosis with respect to the battery based on a minimum cell voltage.

12. A vehicle system comprising:

a battery;

a load operated based on energy supplied from the battery;

a relay disposed between the battery and the load; and a battery diagnostic apparatus, wherein the battery diagnostic apparatus comprises:

a voltage sensor configured to measure voltage of each of a plurality of battery cells within the battery; and a processor configured to perform low voltage diagnosis with respect to the battery based on a cell voltage measured by the voltage sensor, wherein the processor is configured to:

based on the cell voltage satisfying a diagnosis start condition, determine whether the cell voltage satisfies a preset diagnostic condition, and based on the cell voltage satisfying the diagnostic condition, determine that the battery is at a low voltage state, wherein the processor is further configured to:

determine that the cell voltage satisfies the diagnosis start condition, based on the cell voltage being (i) maintained at or greater than a first reference time and (ii) greater than or equal to a first reference voltage and less than or equal to a second reference voltage, determine that the battery satisfies the preset diagnostic condition, based on the cell voltage being (i) maintained at or greater than a preset second reference time and (ii) less than the first reference voltage, and determine that the battery is at the low voltage state based on the preset diagnostic condition being satisfied.

*    *    *    *    *